US009331198B2

(12) United States Patent
Kelber (10) Patent No.: US 9,331,198 B2
(45) Date of Patent: May 3, 2016

(54) CONTROLLED EPITAXIAL BORON NITRIDE GROWTH FOR GRAPHENE BASED TRANSISTORS

(71) Applicant: UNIVERSITY OF NORTH TEXAS, Denton, TX (US)

(72) Inventor: Jeffry Kelber, Denton, TX (US)

(73) Assignee: UNIVERSITY OF NORTH TEXAS, Denton, TX (US)

( * ) Notice: Subject to any disclaimer, the term of this patent is extended or adjusted under 35 U.S.C. 154(b) by 0 days.

(21) Appl. No.: 14/412,709

(22) PCT Filed: Jul. 5, 2013

(86) PCT No.: PCT/US2013/049417
§ 371 (c)(1),
(2) Date: Jan. 5, 2015

(87) PCT Pub. No.: WO2014/008453
PCT Pub. Date: Jan. 9, 2014

(65) Prior Publication Data
US 2015/0144882 A1 May 28, 2015

Related U.S. Application Data

(60) Provisional application No. 61/668,629, filed on Jul. 6, 2012.

(51) Int. Cl.
*H01L 29/78* (2006.01)
*H01L 29/66* (2006.01)
(Continued)

(52) U.S. Cl.
CPC ........ *H01L 29/7827* (2013.01); *H01L 21/0254* (2013.01); *H01L 21/0262* (2013.01); *H01L 21/02425* (2013.01); *H01L 21/02527* (2013.01); *H01L 29/04* (2013.01);
(Continued)

(58) Field of Classification Search
CPC . H01L 29/7827; H01L 29/04; H01L 29/1606; H01L 29/267; H01L 29/66666; H01L 29/76; H01L 21/02425; H01L 21/02527; H01L 21/0254; H01L 21/0262
See application file for complete search history.

(56) References Cited

U.S. PATENT DOCUMENTS

| 2009/0263972 | A1* | 10/2009 | Balseanu | ............ H01L 21/3086 438/696 |
| 2009/0294759 | A1* | 12/2009 | Woo | ........................ B82Y 10/00 257/29 |
| 2016/0005881 | A1* | 1/2016 | Fujii | ................. H01L 29/78687 257/24 |

OTHER PUBLICATIONS

Liu et al. (Liu, Direct Growth of Graphene/Hexagonal Boron Nitride Stacked Layers; Nano Lett. 2011, 11, 2032-2037).*

(Continued)

*Primary Examiner* — Whitney T Moore
(74) *Attorney, Agent, or Firm* — Steven B. Kelber; The Kelber Law Group (57) ABSTRACT

We have demonstrated controlled growth of epitaxial h-BN on a metal substrate using atomic layer deposition. This permits the fabrication of devices such as vertical graphene transistors, where the electron tunneling barrier, and resulting characteristics such as ON-OFF rate may be altered by varying the number of epitaxial layers of h-BN. Few layer graphene is grown on the h-BN opposite the metal substrate, with leads to provide a vertical graphene transistor that is intergratable with Si CMOS technology of today, and can be prepared in a scalable, low temperature process of high repeatability and reliability.

8 Claims, 6 Drawing Sheets

(51) Int. Cl.
*H01L 29/267* (2006.01)
*H01L 29/04* (2006.01)
*H01L 21/02* (2006.01)
*H01L 29/76* (2006.01)
*H01L 29/16* (2006.01)

(52) U.S. Cl.
CPC ......... *H01L 29/1606* (2013.01); *H01L 29/267* (2013.01); *H01L 29/66666* (2013.01); *H01L 29/76* (2013.01)

(56) References Cited

OTHER PUBLICATIONS

Avouris et al. (Avouris; Graphene: synthesis and applications; Materialstoday; Mar. 2012; vol. 15. p. 86-97).*

Britnell, et al., "Field-Effect Tunneling Transistor Based on Vertical Graphene Heterostructures", Science 335 (2012) 947, pp. 1-11.

Ferguson, et al., "Atomic Layer Deposition of Boron Nitride Using Sequential Exposures of BC13 and NH3", Thin Solid Films 413 (2002) 16-25.

Yazyev, et al., "Magnetoresistive Junctions Based on Epitaxial Graphene and Hexagonal Boron Nitride", Physical Review B 80, 035408 (2009).

Yaziri, et al., "A Graphene-Based Hot Electron Transistor", Nano Lett. 2013, 13, 1435-1439.

Mehr, et al., "Vertical Graphene Base Transistor", IEEE Elect. Dev. Lett. 33 (2012) 691.

Kelber, et al., "Multilayer h-BN(0001) on CoSi2(111)/Si(111) by Atomic Layer Deposition: Towards Graphene-Based Transistors without Band Gaps", Abstract: 2012 AMC/Albany, NY.

Ramos, et al., "Influence of a Metallic or Oxide Top Layer in Epitaxial Magnetic Bilayers Containing CoFe2O4(111) Tunnel Barriers", Physical Review B 75, 224421 (2007).

Telling, et al., "Spin Polarization and Barrier-Oxidation Effects at the Co/alumina Interface in Magnetic Tunnel Junctions", Applied Physics Letters vol. 85, No. 17, Oct. 25, 2004.

Hao, et al., "Spin-Filter Effect of Ferromagnetic Europium Sulfide Tunnel Barriers", Physical Review B, vol. 42, No. 13, Nov. 1, 1990.

* cited by examiner

CONTROLLED EPITAXIAL BORON NITRIDE GROWTH FOR GRAPHENE BASED TRANSISTORS

PRIORITY DATA AND INCORPORATION BY REFERENCE

This application claims benefit of priority to U.S. Provisional Patent Application Ser. No. 61/668,629 filed Jul. 6, 2012 which is incorporated by reference in its entirety.

BACKGROUND OF THE INVENTION

1. Field of the Invention

The present invention relates to controlled epitaxial growth of multiple layers of hexagonal boron nitride. The controlled growth multiple layers of hexagonal boron nitride (h-BN), coupled with the ability to deposit microscopically continuous layers of graphene thereon, paves the way for formation of vertically oriented graphene-based transistors. These and similar devices are also the subject of this patent application.

2. Background of the Invention

The direct growth of graphene films, by industrially practical and scalable methods, including CVD, PVD, or MBE, on dielectric substrates is a critical step towards the development of graphene charge- and spin-based devices. We have demonstrated the CVD growth of single and few-layer graphene on monolayer h-BN(0001)/Ru(0001) [1], CVD or PVD growth on MgO(111) [2,3] and MBE layer-by-layer growth on Co3O4(111)/Co(0001) [4]. The growth of graphene on mica by MBE has also recently been demonstrated [5,6]. These findings are summarized in Table I.

Hexagonal boron nitride (h-BN) is an intriguing material for these applications, being isostructural/isoelectronic with graphene. Recent work as reported in L. Britnell, et al., Science 335 (2012) 947 and W. Mehr, et al. IEEE Elect. Dev. Lett. 33 (2012) 691, both of which are incorporated herein by reference for their disclosure graphene based transistor structures, suggests the possibility of vertically-oriented graphene-based transistors in which BN or a similar dielectric is used to control graphene/substrate electron transport, achieving high on/off ratios and operating frequencies in the absence of a graphene band gap.

Methods to prepare the devices described that are susceptible of large scale process formation compatible with Si-CMOS technology limitations are essential before widespread application of such transistors can be realized. The article by Wehr et al. is theoretical only; it neither suggests nor speculates on methods for formation of those devices. While the article by Britnell in fact describes methods for preparing these devices, those methods are not scalable, nor are thy compatible with Si-CMOS technology. In Britnell, the structure described is actually a graphene/h-BN/graphene stack, which does not offer the opportunity to integrate the resulting device with Si-CMOS substrates, the article describing the use of an $SiO_2$ substrate as a gate. Rather than performing controlled deposition of the formation of h-BN, Britnell describes the shattering of relatively thick crystals of h-BN. Thereafter, selected crystals fragments are prepared for the physical transfer of monolayer graphene sheets from a substrate to the h-BN. This is repeated. Neither the process of shattering h-BN crystal and then selecting a promising candidate fragment, nor the physical transfer of a monolayer graphene sheet from one substrate to another is scalable or practical. The resulting graphene device rests on an oxide substrate, which is difficult to further integrate into available devices.

Clearly, applications such as the preparation of integrated vertical graphene transistors would benefit from the ability to precisely control the thickness of h-BN beyond the monolayer limit, suggesting the use of atomic layer deposition (ALD) to form epitaxial h-BN layers with layer-by-layer control. If in fact such epitaxial controlled growth of h-BN can be achieved, the deposition of graphene (one to a few monolayers) thereover is possible in a method consistent with Si-CMOS fabrication. Graphene has been grown by CVD on monolayer h-BN(0001) prepared by ALD, C. Bjelkevig, et al. J. Phys.: Cond. Matt. 22 (2010) 302002.

The use of ALD to form epitaxial multilayers of h-BN, however, has not been reported J. D. Ferguson, A. W. Weimar, S. M. George, Thin Solid Films 413 (2002) describe the formation of a single layer of polycrystalline h-BN by ALD. While of scientific interest, this method is limited. The substrate described for deposition is flakes of insulating $ZrO_2$, another insulator that does not offer a real opportunity for integration with the device. The h-BN of Ferguson is a single layer of polycrystalline h-BN. Ferguson reports that this method is "self-limiting"—that is, a second layer of h-BN cannot be formed. Yet a single layer is unlikely to provide the necessary electron tunneling barrier. Ideally, the barrier element would be subject to modification from substrate material to substrate material so as to be "tunable." Additionally, a useful process will provide the h-BN-based graphene transistor on a useful emitter—possibly silicon or a transition metal generally. It would be of value to develop methods of achieving controlled epitaxial growth of multilayers of h-BN so that vertically oriented graphene based devices could be prepared which take advantage of the properties of graphene on h-BN.

SUMMARY OF THE INVENTION

Figure 1:
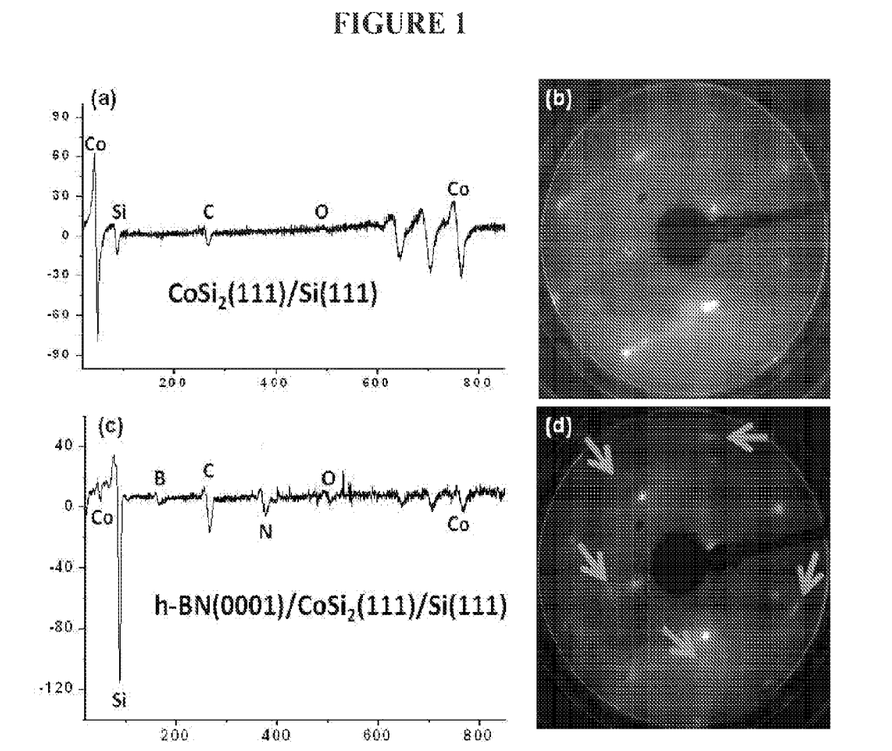
FIG. 1 reflector growth of h-BN(0001) on CoSi$_2$(111)/Si (111): (a) AES and (b) LEED image for ~6 ML CoSi$_2$(111)/Si(111): (c) and (d) corresponding data after 2 BCl$_3$/NH$_3$ ALD cycles at 550 K, followed by annealing in UHV at 1000 K. The total overlayer thickness of CoSi$_2$ is 2-3 monolayers, including contaminant graphitic carbon, due to ALD under non-UHV conditions.

Here we demonstrate the formation of epitaxial multilayer h-BN(0001) using ALD, and also demonstrate the utility of this material for integration of graphene with silicon. Specifically, the use of ALD for formation of multilayers of h-BN (0001) on Si-terminated CoSi2(111)/Si(111) by ALD provides an avenue to the preparation of useful devices. Thin CoSi2(111)/Si(111) layers were formed by Co deposition on Si(111) in ultrahigh vacuum (UHV) followed by annealing to 850 K, resulting in characteristic Auger electron spectra (AES) and low energy electron diffraction (LEED) data (FIG. 1a, b). The surface was then exposed to 4 BCl3/NH3 cycles at pressures of 1.5 Torr/12 min at 550 K, followed by annealing to 1000 K in UHV, yielding a 6-fold BN-characteristic LEED pattern and corresponding Auger spectrum as shown in FIG. 1c, d. The BN-related LEED spots (FIG. 1d, arrows) are streaked, suggesting the two layers are azimuthally rotated with respect to each other. The AES-derived B/N atomic ratio is 0.7 although experience with polycrystalline films grown directly on Si(111) indicates that such films approach a 1:1 ratio upon further deposition, with a deposition rate of 2 AB cycles/monolayer. There is also (FIG. 1a, c) a C(KVV) peak due to film deposition and transport under non-UHV conditions. This feature evolves from a sp3-characteristic lineshape before (FIG. 1a) to graphitic after (FIG. 1c) BN deposition/annealing. Further information is provided on the effects of substrate/BN interactions on electronic structure and in subsequently deposited graphene on the BN.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

FIG. 6 illustrates the vertical transistor of the invention. Metal substrate 100 is provided with multiple layers of epitaxial hexagonal Boron Nitride (h-BN) 200 there over. A layer of graphene 300 is formed on the h-BN opposite the metal substrate.

DETAILED DESCRIPTION OF THE INVENTION

Results

The data in Table I demonstrates the significant impact of substrate/graphene interactions on graphene properties, including strong interfacial charge transfer, and band gap formation. Charge transfer may strongly impact carrier mobility in graphene [7], while graphene band gap formation at zero applied voltage may have both positive (increased on/off ratio) and negative (decreased carrier mobility) implications for graphene-based FET-like devices. Additionally, graphene growth on magnetic oxides has substantial implications for induced graphene magnetic behavior [8].

Charge Transfer: Why BN Matters

Figure 2:
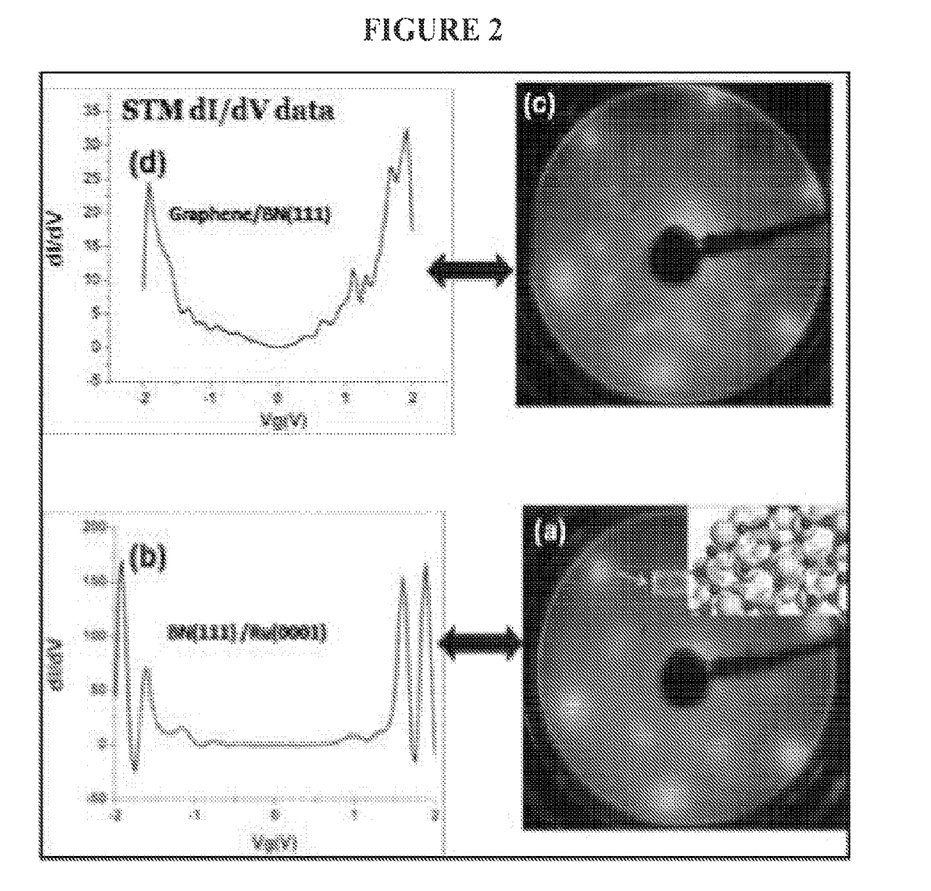
FIG. 2 gives LEED and STM dI/dV data for BN monolayer and graphene/BN heterojunction grown on Ru(0001): (a) LEED image for h-BN(0001)/Ru(0001). Main LEED spots are bifurcated, as shown by enlarged spot image (in red); model at right illustrates R30($\sqrt{3}\times\sqrt{3}$) unit cell derived from LEED image; (b) corresponding STM dI/dV data (c) LEED image for graphene/h-BN/Ru(0001); (d) corresponding STM dI/dV data.

The data in Table I demonstrates that graphene/substrate interactions can profoundly affect graphene properties. Graphene was grown by CVD on a monolayer of h-BN(0001) formed by atomic layer deposition (ALD) on Ru(0001) [1]. Scanning tunneling spectroscopy (STS) and low energy electron diffraction (LEED) data showed significant orbital hybridization at the BN/Ru and graphene/BN interfaces [1] (FIG. 2). Inverse photoemission and a ~350 cm-1 redshift in the Raman 2D feature [3] indicate significant substrate→graphene charge transfer that fills the graphene π* band.

TABLE I

Summary of results for direct graphene growth on nitride or oxide substrates

| Substrate | Remarks | LEED | Reference |
|---|---|---|---|
| h-BN(0001) monolayer on Ru(0001) | Strong substrate → graphene charge transfer; filled π* band | C6v | 1, 2 |
| MgO(111) | Band gap (~0.5-1 eV); Graphene → substrate charge transfer | C3v | 2, 3 |
| Co3O4(111 | Incommensurate interface, graphene → substrate charge transfer | C6v | 4 |
| mica | Some carbon oxidation | N/A | 5, 6 |

Such band-filling may have important implications for graphene electron and hole mobilities [7]. In contrast to graphene/monolayer h-BN(0001)/R(0001), the Raman spectra for graphene grown on h-BN nanoflakes by flame pyrolysis indicate negligible charge transfer. These results strongly suggest that increasing the thickness of the BN layer will allow systematic "tuning" of charge transfer, as well as substrate/graphene tunneling or leakage interactions. Unfortunately, such multilayers are difficult to obtain by the conventional route of borazine thermal CVD, as the formation of the first complete layer typically yields a surface inert to further reaction [9, 10].

Figure 3:
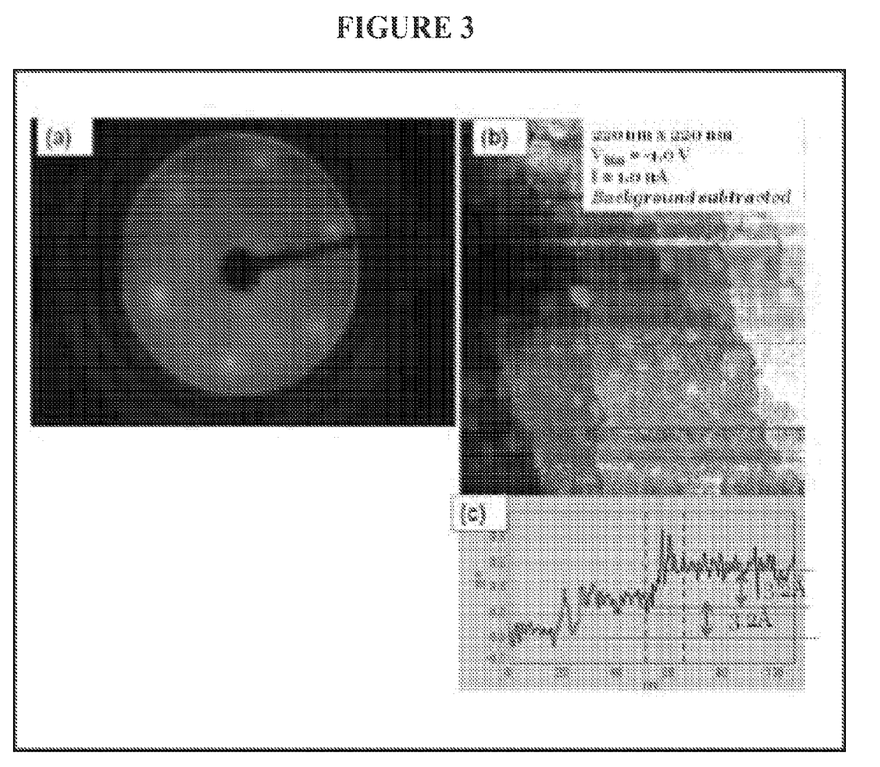
FIG. 3 is (a) LEED, (b) STM constant current image and (c) corresponding line scan for a trilayer h-BN film grown by ALD on Ru(0001). The 3.2±0.1 Å step heights (c) are characteristic of h-BN.

In contrast, h-BN polycrystalline films have been grown using ALD, employing cycles of BCl3 and NH3 [11]. We have used this process to obtain epitaxial multilayer films on Ru(0001). STM and LEED data are shown (FIG. 3) for a trilayer h-BN(0001) film formed by 6 BCl3/NH3 cycles at 550 K, followed by annealing at 1000 K to induce long-range order. The data in FIG. 3 demonstrates the capability to grow epitaxial h-BN(0001) substrates by ALD. The data in FIG. 3 also demonstrates the potential for multilayer epitaxial growth of h-BN(0001) layers on suitable substrates with atomic precision, thus permitting the fine-tuning of graphene/substrate interactions.

Band Gap Formation an Oxides

Although density functional theory calculations have suggested [12] the formation of a small (~0.05 eV) band gap for graphene on BN, none was observed at room temperature [1,2]. In contrast a band gap of ~0.5-1 eV has been observed for single [13] and few-layer graphene films [2] grown on MgO(111). Band gaps of this magnitude are suitable for FET applications [14,15]. Importantly, these graphene films display C3v symmetry, while graphene films grown on other dielectric substrates (Table I), and on Ru(0001) display LEED with six-fold symmetry [3].

Figure 4:
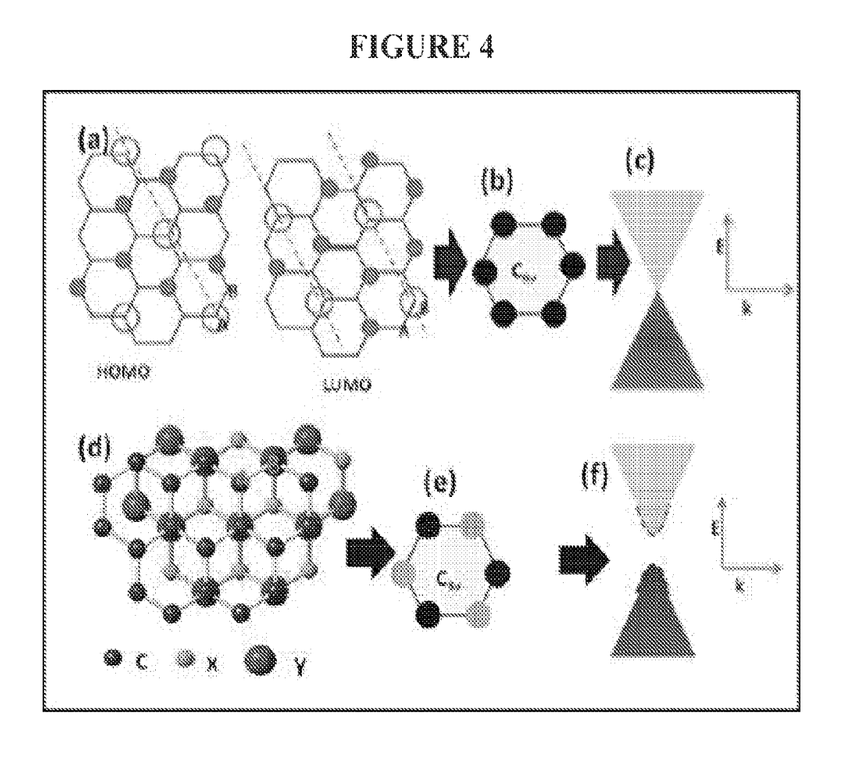
FIG. 4 reflects substrate-induced band gap formation in graphene. (a) HOMO and LUMO orbitals of isolated graphene lattice at the Dirac point are degenerate due to A site/B site equivalence, yielding (b) $C_{6v}$ LEED and (c) no band gap at the Dirac point. Suitable graphene/substrate interactions (d) lift the A site/B site chemical equivalence, yielding (e) $C_{3v}$ LEED symmetry and (f) a band gap at the Dirac point. For a discussion of graphite HOMO and LUMO, see ref 16.

The relationship between C3v LEED symmetry and substrate-induced graphene band gap formation is shown in FIG. 4. In the isolated graphene lattice, the A and B sites are crystallographically distinct but chemically equivalent [17]. This leads to HOMO/LUMO degeneracy, C6V LEED symmetry (FIG. 4a,b), and zero band gap at the Dirac point (FIG. 4c). However, suitable graphene/substrate interactions (FIG. 4d) lift A site/B site chemical equivalence, yielding C3v LEED symmetry (FIG. 4e) and a band gap at the Dirac point (FIG. 4f).

Figure 5:
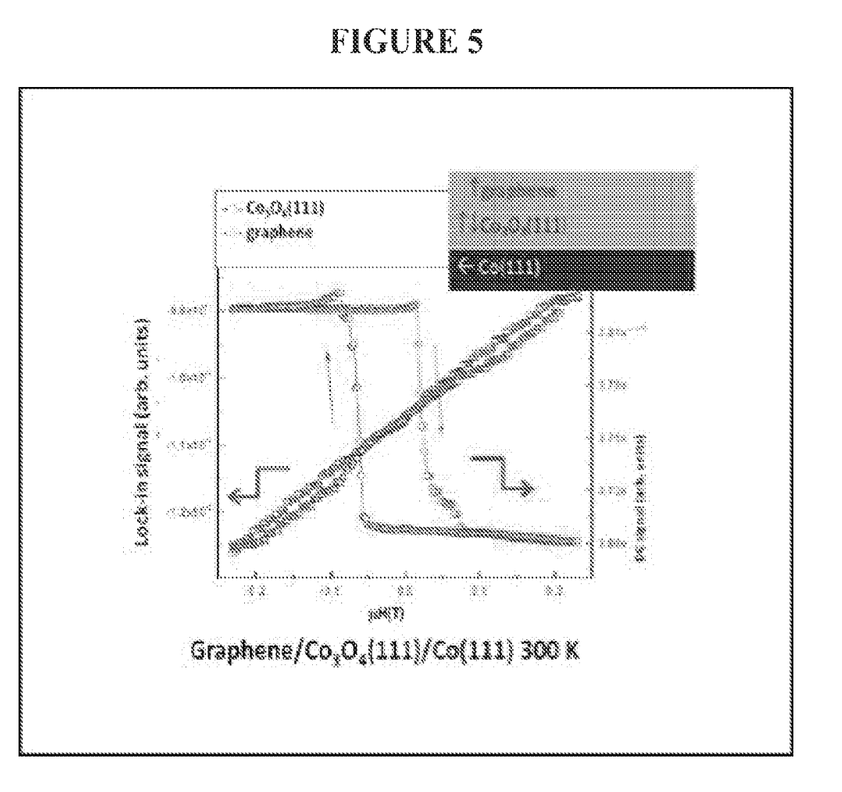
FIG. 5 shows 300 K Reflectivity data (red) and MOKE data (blue) indicating ferromagnetic hysteresis for graphene conduction electrons, induced by antiferromagnetic ordering of Co ions and ferromagnetic ordering of the Co(0001) substrate in a 3 ML graphene/Co$_3$O$_4$(111)/Co(0001) sample. Inset: relative ordering of spins in the graphene, oxide and metal layers indicated by reflectivity and MOKE measurements.
Figure 6:
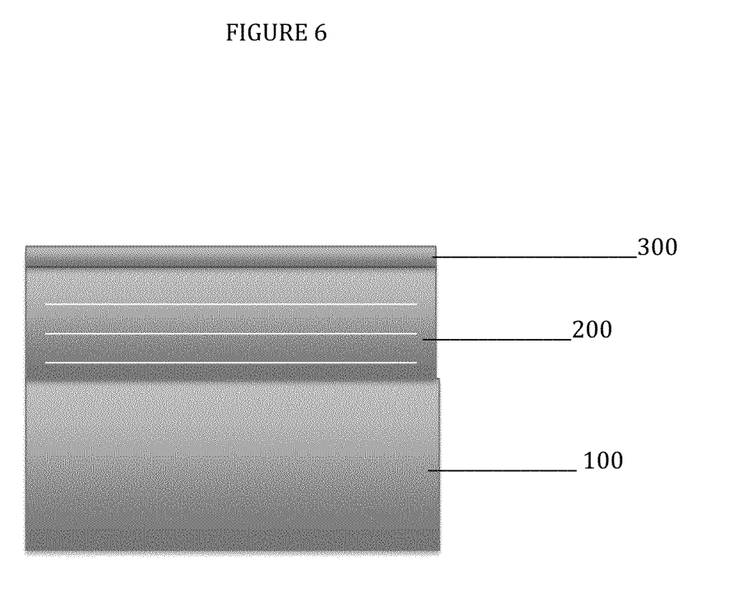

A puzzling aspect of graphene on MgO is the persistence of C3v LEED and a sizeable band gap in both single and few layer films [2, 3, 14]. This strongly suggests a commensurate interface lifting A site/B site chemical equivalence, as in FIG. 5d. However, the O—O nearest neighbor distance at the bulk-terminated MgO(111) surface is >2.8 Å, compared to the graphene lattice constant of ~2.5 Å. In the absence of surface reconstruction, the oxide/graphene interface is incommensurate, and graphene A and B sites should see a similar distribution of substrate environments, leading to A site/B site average equivalence, C6v LEED symmetry, and zero band gap. The experimental results [2, 3, 13] therefore strongly suggest a commensurate graphene/MgO(111) interface, and therefore MgO(111) surface reconstruction [17]. The MgO (111) surface is prone to reconstruction, as the (111) surface is either entirely O anion or Mg cation in nature, yielding an unstable Madelung potential, and reconstruction during metallization [18,19]. Experimental results, including LEED [3], and core level photoemission [17] are at least consistent with such a reconstruction.

In contrast to MgO(111), the growth of graphene on Co3O4 (111) yields an incommensurate grapheme/oxide lattice, and C6V leed symmetry, consistent with FIG. 5 d, e. No experimental evidence of band gap formation has been obtained, although transport measurements are in progress.

The apparent lack of a band gap for graphene/Co3O4(111) corresponds to the more stable spinel structure for that oxide, especially due to cation/anion relaxations at the surface that enhance this stability [20].

In summary, the model shown schematically in FIG. 4 predicts the absence of a band gap for graphene/Co3O4(111), consistent with existing experimental data. However, this model also suggests that band gap formation might be observed for graphene/NiO(111), as well as for other oxides with the rock salt structure.

Graphene Interactions with Magnetic Oxides

Theoretical work [8] suggests that graphene in proximity to a ferromagnetic oxide would exhibit substrate-induced ferromagnetism. Further, such an effect appears to be relatively insensitive to graphene/oxide orbital hybridization. Recent room temperature reflectivity/magneto-optic Kerr effect (MOKE) measurements have verified this effect for 3 monolayers (ML) graphene/Co3O4(111)/Co(0001) (FIG. 5). The sample consists of ~3 ML graphene/3 ML oxide/~30 Å Co(111) grown on sapphire (0001) [4]. The reflectivity data, sensitive to the graphene $\pi \rightarrow \pi^*$ transition (red laser light) indicate a distinct hysteresis loop (FIG. 5, red trace), and reversible polarization of the graphene conduction electrons in the plane perpendicular to the sample (FIG. 5 inset). MOKE data for the oxide—at 260 K above its Néel temperature (FIG. 5, blue)—indicate a corresponding antiferromagnetic hysteresis loop, with cation spins adjacent to the graphene interface polarized perpendicular to the sample, yielding strong ferromagnetic exchange interactions with the graphene conduction electrons. (The Co(111) surface orders in plane as expected—data not shown.)

DISCUSSIONS AND CONCLUSIONS

The above data have significant implications for graphene charge and spin devices. In the absence of a band gap, transistors formed from graphene/SiC exhibit on/off ratios of ~30—hardly practical for most applications [21]. While a band gap >0.5 eV is suitable for non-tunneling transistor applications [14, 15], the formation of a band gap would alter the dispersion near the Dirac point (FIG. 4f), increasing the electron effective mass and lowering mobility. Thus, graphene applications involving Si CMOS FETs face a dilemma: finding a suitable band gap/mobility trade-off that leads to both useful on/off ratios (e.g., >103) and mobility substantially greater than the ~103 V/cm2-sec value for electrons in Si. In this respect, the recently proposed vertical graphene base transistor [22], which does not depend on a graphene band gap for high on/off ratios, would seem to offer considerable opportunity.

The data shown in FIG. 5 have significant consequences for graphene spin valves. Such devices have been formed from graphene physically transferred to SiO2 [23, 24] but exhibit magnetoresistance values of only ~10%, and at cryogenic temperatures. This is due to the necessity of injecting individual spins from the source into the drain via diffusion through the graphene lattice—an extremely inefficient process [23, 25]. In contrast, the uniform polarization of graphene conduction electrons would lead to coherent spin transport, as recently suggested for graphene with intercalated ferromagnetic layers, resulting in calculated magnetoresistance values >200% at room temperature [26]. Taking this forward, graphene deposition on magnetic oxides provides an avenue for a new generation of practical, low power spintronic devices based on coherent spin transport.

Although work on graphene/substrate interface effects will continue along a number of avenues, the results reflected here on the first reported growth of multilayer epitaxial h-BN on a metal substrate provides an immediate route to "tunable" band-gap free vertical transistors. Deposition using the methods described herein should work for most metals, possibly excepting copper, which is chlorine-loving but does not interact well with the nitrogen or N—H used in ALD. Suitable substrates include silicon, as well as metals overlying silicon, including beyond ruthenium, cobalt, chrome, nickel and iron. Other candidate metals include platinum and palladium. All are consistent with the above-disclosed ALD formation of multi-layer h-BN. Thus, a useful working device includes a silicon substrate, or possibly a silicon substrate with an overlying metal such as those described above. Generally, the h-BN stack will comprise from 3-10 epitaxial layers of h-BN, but larger stacks can be envisioned to turn the transistor to particular needs or materials.

The ability to epitaxially deposit multiple h-BN layers is of importance beyond the ability to "tune" the resulting device, however. Single lay h-BN, such as the advances reported by Ferguson et al, [11] is susceptible to orbital hybridization, with a substrate. This is particularly the case with transition metal substrates, such as those employed herein, which exhibit partially filled "d" orbitals. This hybridization phenomenon has been shown repeatedly for monolayer born nitride. Orbital hybridization leads to undesirable charge transfer between the substrate and the graphene, even if the device incorporating the transistor is "OFF"—there is no bias between the graphene and the BN. By increasing the number of BN layers, employing the method and structures disclosed herein, orbital hybridization and the resulting charge transfer phenomena is regulated.

Accordingly, in the claimed invention, a metal substrate is selected. This substrate might be silicon prepared according to common methods, or a metal, or a metal on silicon from the correct emitter. In some embodiments, the metal formation on silicon will lead to the formation of a silicide layer, such as a Co/CoSi$_2$/Si substrate. On the active surface of the substrate, multiple monolayers of h-BN are formed, to provide a tunneling barrier of height and "shape" necessary for the preferred application, as described above using ALD. Graphene is deposited, by CVD or MBE, on the h-BN stack, followed by the provision of suitable leads. The leads may be of any conductor, but are preferably of, or compatible with, the metal of the substrate.

There is general agreement that for logic applications, a graphene FET needs to exhibit ON-OFF rates at room temperature in excess of $10^4$. The devices described here will exhibit ON-OFF rates at room temperature of about $10^5$-$10^6$. While this is not as great as values currently exhibited by some advanced silicon based FETs, it is easily high enough to be used in current arrays and incorporated into current devices. The ability to integrate new graphene FETs into existing designs, rather than redesigning existing arrays and devices to suit the characteristics of graphene FETS, is critical for commercial adoption. These "vertical transistors" satisfy that need for ON-OF rations. In a vertical transistor of the type disclosed and claimed herein, traditional carrier mobilities are not of importance. Graphene carrier mobilities are traditionally very high, even at room temperature. Lateral mobilities in the devices disclosed, with graphene deposited/grown on a h-BN substrate, rather than transferred, will exceed 2000 $cm^2$/V-sec, on up to about 5,000 $cm^2$/V-sec or more.

The resulting devices should exhibit high, and adjustable, ON-OFF rates approaching those exhibited by conventional devices, while providing high, and again, adjustable, lateral mobility. The ability to change the h-BN barrier and thereby balance speed and ON-OFF rates while suppressing charge transfer between the substrate and graphene offers an opportunity to take advantage of the superior electrical properties of graphene without the existence of a band gap in a method consistent with current fabrication and architecture employed in Si CMOS technology. This will permit the preparation of transistors with predetermined desirable characteristics, including ON-OFF rates of $10^4$-$10^6$.

The various embodiments described above have been set forth in detail and by generic description. Unless specifically called out by the claims below, these examples are not intended to be limiting, and should be read consistent with the intended scope of the invention as expressed.

REFERENCES

[1] C. Bjelkevig, Z. Mi, J. Xiao, P. A. Dowben, L. Wang, W. Mei, J. A. Kelber, J. Phys.: Cond. Matt. 22, 302002 (2010).
[2] L. Kong, C. Bjelkevig, S. Gaddam, M. Zhou, Y. H. Lee, G. H. Han, H. K. Jeong,
N. Wu, Z. Zhang, J. Xiao, P. A. Dowben, J. A. Kelber, J. Phys. Chem. C. 114, 21618 (2010).
[3] S. Gaddam, C. Bjelkevig, S. Ge, K. Fukutani, P. A. Dowben, J. A. Kelber, J. Phys.: Cond. Matt. 23, 072204 (2011).
[4] M. Zhou, F. L. Pasquale, P. A. Dowben, A. Boosalis, M. Schubert, V. Darakchieva, R. Yakimova, J. A. Kelber, J. Phys.: Cond. Matt. 24, 072201 (2012) 072201.
[5] G. Lippert, J. Dabrowski, M. Lemme, C. Marcus, O. Seifarth, G. Lupina, Phys. Stat. Sol. B 248, 2619 (2011).
[6] O. Seifarth, G. Lippert, J. Dabrowski, G. Lupina, W. Mehr, Proc., IEEE Conf. on Semiconductors (Sep. 27-28, 2011; Dresden) p. 1 (2011).
[7] E. H. Hwang, S. Adam, S. D. Sarma, Phys. Rev. B 76 195421 (2007).
[8] H. Haugen, D. Huertas-Hernando, A. Brataas, Phys. Rev. B 77, 115406 (2008).
[9] C. Oshima, A. Itoh, E. Rokuta, T. Tanaka, K. Yamashita, T. Sakuri, Sol. St. Commun 116, 37 (2000).
[10] A. Nagashima, N. Tejima, Y. Gamou, T. Kawai, C. Oshima, Phys. Rev. Lett. 75 3918 (1995).
[11] J. D. Ferguson, A. W. Weimar, S. M. George, Thin Sol. Films 413, 16 (2002).
[12] G. Giovannetti, P. A. Khomyakov, G. Brocks, P. J. Kelly, J. van den Brink, Phys. Rev. B 76 073103 (2007).
[13] J. A. Kelber, M. Zhou, S. Gaddam, F. Pasquale, L. Kong, P. A. Dowben, Proc. ECS (2012) in press.
[14] M. Cheli, P. Michetti, G. Iannaccone, IEEE Trans. Elect. Dev. 57, 1936 (2010).
[15] P. Michetti, M. Cheli, G. Iannaccone, Appl. Phys. Lett. 96, 133508 (2010).
[16] P. A. Cox, The Electronic Structure and Chemistry of Solids, Oxford University Press, 1987.
[17] J. A. Kelber, S. Gaddam, C. Vamala, S. Eswaran, P. A. Dowben, Proc. SPIE 8100, 8100-Y1 (2011).
[18] S. Yuasa, T. Nagahama, A. Fukushima, Y. Suzuki, K. Ando, Nature Materials 3 868 (2004).
[19] J. Goniakowski and C. Noguera, Phys. Rev. B 66 085417 (2002).
[20] W. Meyer, K. Biedermann, M. Gubo, L. Hammer, K. Heinz, J. Phys.: Cond. Matt. 20 265011 (2008).
[21] X. Li, X. Wu, M. Sprinkle, F. Ming, M. Ruan, Y. Hu, C. Berger, W. A. de Heer, Phys. Stat. Sol. A 207 286 (2010).
[22] W. Mehr, J. Dabrowski, C. Scheytt, G. Lippert, Y. Xie, M. C. Lemme, M. Ostling, G. Lupina, IEEE Elect. Dev. Lett. 33, 691 (2012).
[23] N. Tombros, C. Jozsa, M. Popinciuc, H. T. Jonkman, B. J. van Wees, Nature 448, 571 (2007).
[24] W. Han, K. Pi, H. Wang, M. McCreary, Y. Li, W. Bao, P. Wei, J. Shi, C. N. Laun, R. K. Kawakami, Proc. SPIE 7398, 739819-1 (2009).
[25] B. Dlubak, P. Seneor, A. Anane, C. Barraud, C. Deranlot, D. Deneuve, B. Servet, R. Mattana, F. Petroff, A. Fert, Appl. Phys. Lett. 97, 092502 (2010).
[26] J. Zhou, L. Wang, R. Qin, J. Zheng, W. N. Mei, P. A. Dowben, S. Nagase, Z. Gao, J. Lu, J. Phys. Chem. C 115, 25280 (2011).

What is claimed is:

1. A vertical graphene transistor comprising:
a metal substrate, multiple layers of epitaxial hexagonal Boron Nitride (h-BN) there over, and
a layer of graphene formed on said h-BN opposite the metal substrate, wherein said h-BN is comprised of a number of epitaxial layers of h-BN sufficient to provide a barrier layer thickness to develop predetermined ON-OFF rates and lateral mobility in excess of 2000 $cm^2$/V-sec.

2. The vertical graphene transistor of claim 1, wherein said substrate is comprised of silicon, ruthenium, cobalt, chrome, nickel, iron, platinum or palladium.

3. The vertical graphene transistor of claim 2, wherein said metal is a metal silicide.

4. The vertical graphene transistor of claim 1, wherein that transistor is fabricated on a substrate used to form part of an array in a complementary metal oxide semiconductor (CMOS) integrated circuit.

5. The vertical graphene transistor of claim 1, wherein said transistor exhibits ON-OFF ratios of in excess of $10^4$.

6. A method of preparing the vertical graphene transistor of claim 1, comprising:
forming multiple layers of epitaxial h-BN on a major surface of a metal substrate by atomic layer deposition (ALD) and depositing a layer of graphene on a surface of said h-BN opposite the surface on said substrate, and providing electrical contacts on said graphene, wherein a number of said layers of h-BN formed on said substrate is determined by the number of layers required to suppress orbital hybridization of said h-BN and provide a predetermined ON-OFF rate for said device.

7. The process of claim 6, wherein said process comprises forming from 3-15 epitaxial layers of h-BN on said substrate.

8. The process of claim 6, wherein said step of depositing graphene comprises depositing from one to three monolayers of graphene on h-BN by chemical vapor deposition or molecular beam epitaxy.

* * * * *